(12) United States Patent
Kothnur et al.

(10) Patent No.: US 11,970,775 B2
(45) Date of Patent: Apr. 30, 2024

(54) SHOWERHEAD FOR PROVIDING MULTIPLE MATERIALS TO A PROCESS CHAMBER

(71) Applicant: APPLIED MATERIALS, INC., Santa Clara, CA (US)

(72) Inventors: Prashanth Kothnur, San Jose, CA (US); Satish Radhakrishnan, San Jose, CA (US); Alexander Lerner, San Jose, CA (US); Sergei Klimovich, Saint-Petersburg (RU); Roey Shaviv, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 294 days.

(21) Appl. No.: 16/533,357

(22) Filed: Aug. 6, 2019

(65) Prior Publication Data
US 2020/0048767 A1 Feb. 13, 2020

Related U.S. Application Data

(60) Provisional application No. 62/717,602, filed on Aug. 10, 2018.

(51) Int. Cl.
*C23C 16/455* (2006.01)
*B05B 1/18* (2006.01)
*B05B 1/20* (2006.01)

(52) U.S. Cl.
CPC ........ *C23C 16/45548* (2013.01); *B05B 1/185* (2013.01); *B05B 1/20* (2013.01)

(58) Field of Classification Search
None
See application file for complete search history.

(56) References Cited

U.S. PATENT DOCUMENTS

| 5,500,256 | A | * | 3/1996 | Watabe | ............... | C23C 16/5096 |
| | | | | | | 427/255.394 |
| 8,551,248 | B2 | | 10/2013 | Goodlin et al. | | |
| 8,967,081 | B2 | * | 3/2015 | Borean | ............. | C23C 16/45574 |
| | | | | | | 118/724 |
| 9,677,176 | B2 | | 6/2017 | Chandrasekharan et al. | | |

(Continued)

FOREIGN PATENT DOCUMENTS

JP 2005072424 A 3/2005

*Primary Examiner* — Karla A Moore
(74) *Attorney, Agent, or Firm* — MOSER TABOA

(57) ABSTRACT

Embodiments of a showerhead are described herein. In some embodiments, a showerhead assembly includes: a first gas delivery portion having a first body, a first inlet, and a plurality of first tubes extending from the first body and defining a first plenum, wherein each tube of the plurality of first tubes includes a plurality of first holes; and a second gas delivery portion having a second body, a second inlet, and a plurality of second tubes extending from the second body and defining a second plenum fluidly independent from the first plenum, wherein each tube of the plurality of second tubes includes a plurality of second holes, and wherein the plurality of first tubes are disposed in an alternating pattern with the plurality of second tubes across a width of the showerhead assembly and a heat sink disposed between the plurality of first tubes and the plurality of second tubes.

17 Claims, 4 Drawing Sheets

(56) References Cited

U.S. PATENT DOCUMENTS

| | | | |
|---|---|---|---|
| 2002/0084352 A1* | 7/2002 | Chen | C23C 16/45565 239/390 |
| 2004/0099213 A1* | 5/2004 | Adomaitis | C23C 16/52 118/715 |
| 2004/0216665 A1* | 11/2004 | Soininen | C23C 16/4412 118/715 |
| 2006/0096541 A1 | 5/2006 | Seo et al. | |
| 2009/0098276 A1* | 4/2009 | Burrows | C23C 16/45565 427/8 |
| 2009/0136652 A1 | 5/2009 | Washington et al. | |
| 2012/0097330 A1 | 4/2012 | Iyengar et al. | |
| 2014/0209242 A1* | 7/2014 | Sun | H01L 21/67103 156/345.34 |
| 2014/0235069 A1* | 8/2014 | Breiling | C23C 16/45565 239/548 |
| 2019/0352777 A1* | 11/2019 | Shankar | C23C 16/45574 |

\* cited by examiner

SHOWERHEAD FOR PROVIDING MULTIPLE MATERIALS TO A PROCESS CHAMBER

CROSS-REFERENCE TO RELATED APPLICATIONS

This application claims benefit of U.S. provisional patent application Ser. No. 62/717,602, filed Aug. 10, 2018 which is herein incorporated by reference in its entirety.

FIELD

Embodiments of the present disclosure generally relate to substrate processing equipment and techniques, and more particularly, to an apparatus for supplying gases to a reaction chamber.

BACKGROUND

Organic vapor deposition is becoming increasingly relevant in building semiconductor devices such as complementary metal oxide semiconductor (CMOS) image sensors (CIS) and other optical devices. However, the inventors have observed that depositing organic material on a workpiece in a deposition process is problematic due to purity and/or contamination concerns that, among other things, prevent the use of a carrier gas.

Often, there is a need to deposit more than one material at a time. However, without the use of a carrier gas, the inventors have observed that co-depositing a cooler material with a warmer material can cause the cooler material to dissociate and cause the warmer material to condense.

Accordingly, the inventors have provided an improved apparatus for depositing multiple materials onto a substrate.

SUMMARY

Embodiments of apparatus for supplying multiple process gases, such as vaporized reactants, to a reaction chamber are described herein. In some embodiments, a showerhead assembly for depositing multiple materials on a substrate includes: a first gas delivery portion having a first body, a first inlet, and a plurality of first tubes extending from the first body and defining a first plenum, wherein each tube of the plurality of first tubes includes a plurality of first holes; a second gas delivery portion having a second body, a second inlet, and a plurality of second tubes extending from the second body and defining a second plenum fluidly independent from the first plenum, wherein each tube of the plurality of second tubes includes a plurality of second holes, and wherein the plurality of first tubes are disposed in an alternating pattern with the plurality of second tubes across a width of the showerhead assembly; and a heat sink disposed between the plurality of first tubes and the plurality of second tubes.

In some embodiments, a showerhead assembly for depositing multiple materials on a substrate includes a first gas delivery portion having a first body, a first inlet, and a plurality of first tubes extending from an inner surface of the first body and defining a first plenum, wherein each tube of the plurality of first tubes includes a plurality of first holes, and wherein the plurality of first tubes vary in length across a width of the showerhead assembly; a second gas delivery portion having a second body, a second inlet, and a plurality of second tubes extending from an inner surface of the second body and defining a second plenum fluidly independent from the first plenum, wherein each tube of the plurality of second tubes includes a plurality of second holes, wherein the plurality of second tubes vary in length across the width of the showerhead assembly, and wherein the plurality of first tubes are disposed in an alternating pattern with the plurality of second tubes across the width of the showerhead assembly; and a heat sink disposed between the plurality of first tubes and the plurality of second tubes.

In some embodiments, a deposition chamber, includes a chamber body having a floor, one or more sides, and a lid to define an interior volume; a showerhead assembly disposed in the interior volume and having a first gas delivery portion having a first inlet fluidly coupled to a plurality of first tubes having a plurality of first holes and a second gas delivery portion having a second inlet fluidly coupled to a plurality of second tubes having a plurality of second holes; and a precursor delivery system configured to deliver a first process material to the first gas delivery portion at a first temperature and a second process material to the second gas delivery portion at the first temperature or at a second temperature different than the first temperature.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate some embodiments of the disclosure and are therefore not to be considered limiting of scope, for the disclosure may admit to other equally effective embodiments.

Figure 1:
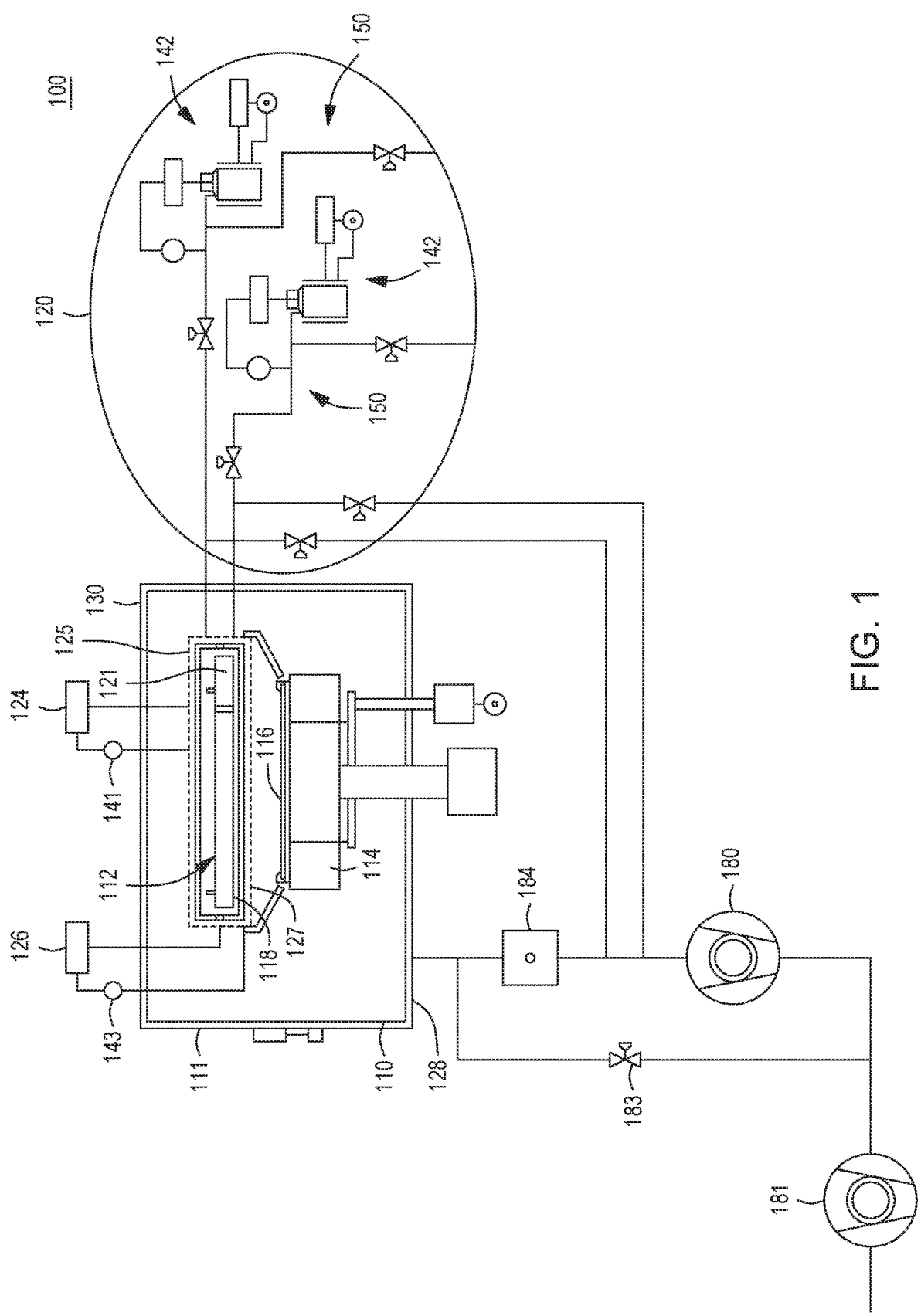
FIG. 1 shows a deposition system having a showerhead in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus for processing a substrate and/or providing multiple process materials to a process chamber such as a deposition chamber are provided herein. The apparatus of the present disclosure includes a showerhead and/or delivery system configured to advantageously prevent thermal cross-talk between two or more adjacent process materials before exiting the delivery system. For example, two or more species or samples of process material may be individually processed through the apparatus in thermal isolation at the same or different temperatures prior to exiting a showerhead and condensing on a substrate. Although the process may be described in terms of organic thin films grown or condensed on a substrate or workpiece, the process of the present disclosure may be applied to any chemical vapor deposition (CVD), metal-organic chemical vapor deposition, metal-organic vapor phase epitaxy, or thin film deposition process to deliver multiple process materials to improve the resultant film and reduce contamination levels in the system.

FIG. 1 shows a deposition system 100 in accordance with some embodiments of the present disclosure. The deposition system 100 includes a deposition chamber 110 defined, at least in part, by one or more sides 111, a floor 128, and a lid 130. The deposition system 100 is configured to process a substrate, such as substrate 116, in the deposition chamber 110. The substrate is supported by a substrate support 114 disposed in the deposition chamber 110. In some embodiments, the deposition chamber 110 may be a CVD chamber configured to perform process material deposition such as organic precursor deposition in accordance with the present disclosure. One non-limiting system suitable for use or adapted for use in accordance with the present disclosure is the ENDURA® line of processing systems available from Applied Materials, Inc. of Santa Clara, California Other processing systems, including those available from other manufacturers, can also be modified in accordance with the teachings provided herein. In some embodiments, the apparatus in accordance with the present disclosure may be utilized in a chamber configured to perform atomic layer deposition (ALD).

In some embodiments, an organic layer (not shown), or derivatives thereof may be formed, condensed, or deposited by a deposition process on substrate 116. In some embodiments, the layer may be formed of multiple process materials that would otherwise undesirably react with each other within a conventional showerhead. In some embodiments, the layer may be formed of multiple process materials that have difference process requirements, such as flow rate, temperature, or the like. In some embodiments, suitable process materials for use in the apparatus of the present disclosure include any material suitable for sublimation and condensation on a substrate, for example tris (8-hydroxyquinolinato) aluminum (Alq3) or buckminsterfullerene ($C_{60}$). Other process gases may also suitably be used, in particular but not limited to, process gases that require one or more of different flow rates, different temperatures, or different gas distribution systems to prevent reactions between the respective process gases within the gas distribution system.

The deposition system 100 includes the deposition chamber 110 and a precursor delivery system 120. In some embodiments, the precursor delivery system 120 may include one or more heating systems 142 (two shown in FIG. 1). In some embodiments, the precursor delivery system 120 may include one or more gas delivery systems 150 (two shown in FIG. 1). In some embodiments, the components of the deposition system 100 are connected and in communication such that processing material in the one or more heating systems 142 may be sublimated and subsequently passed through gas delivery system 150 into deposition chamber 110. In some embodiments, the one or more heating systems 142, the gas delivery system 150, and the deposition chamber 110 may be in fluid communication.

The precursor delivery system 120 is configured to deliver the multiple process materials to a showerhead assembly 112 and substrate 116 in fluid communication with showerhead assembly 112. The showerhead assembly 112 includes a first gas delivery portion 118 and a second gas delivery portion 121. The first and second gas delivery portions 118, 121 are fluidly isolated from each other (e.g., material in the first gas delivery portion 118 cannot intermix with or contact the materials in the second gas delivery portion 121 within the showerhead assembly 112). The precursor delivery system 120 is capable of delivering a first process material to the first gas delivery portion 118 at a first temperature. The precursor delivery system 120 is capable of delivering a second process material to the second gas delivery portion 121 at the first temperature or at a second temperature different than the first temperature. In addition to the fluid isolation provided between the first and second gas delivery portions 118, 121, in some embodiments, the first gas delivery portion 118 and the second gas delivery portion 121 are further configured to reduce or prevent thermal crosstalk between the first process material and the second process material prior to exiting into the deposition chamber 110. In other words, the temperature of the first process material will not affect, or will have a lessened effect on, the temperature of the second process material within the showerhead assembly 112. In some embodiments, a temperature difference between the first process material and the second process material is between 270 to 550 degrees Celsius. In some embodiments, the showerhead assembly 112 is configured to deliver process material to the deposition chamber 110 without condensing the one or more process material(s) therein.

In some embodiments, the deposition system 100 may include components used to execute and monitor pre-determined processes (e.g., depositing films) in the deposition system 100. Such components generally include various sub-systems (e.g., vacuum and exhaust sub-systems, and the like) and devices (e.g., power supplies, process control instruments, and the like) of the deposition system 100. In some embodiments, the deposition system 100 includes a first pump 180, a second pump 181, a throttle valve 184, and a pressure valve 183 to control the pressure of the system and bring or maintain the deposition system 100 at vacuum conditions. The pressure valve 183 may be included to remove vacuum conditions.

A first heating assembly 125 applies heat to the first gas delivery portion 118. The first heating assembly 125 may comprise one or more heating elements configured to maintain the first gas delivery portion 118 at a substantially uniform temperature. In some embodiments, a heating element is placed on each tube of the plurality of first tubes (discussed below). The first heating assembly 125 is configured to apply heat to a first process material passing through the first gas delivery portion 118 at a predetermined temperature, such as the first temperature, as the first process material moves into the deposition chamber 110.

In some embodiments, a first temperature sensor 141 and a first temperature controller 124 are coupled to the first gas delivery portion 118. The first temperature sensor 141 is configured to obtain thermal information from the first gas delivery portion 118. The first temperature controller 124 is configured to receive input from the first temperature sensor 141 to control, adjust, or set a temperature of the first heating assembly 125. The first temperature sensor 141 can be a thermocouple, a pyrometer, or the like.

A second heating assembly 127 applies heat to the second gas delivery portion 121. The second heating assembly 127 may comprise one or more heating elements configured to maintain the second gas delivery portion 121 at a substantially uniform temperature. In some embodiments, a heating element is placed on each tube of the plurality of second tubes (discussed below). The second heating assembly 127 is configured to apply heat to a second process material passing through the second gas delivery portion 121 at a predetermined temperature, such as the second temperature, as the second process material moves into the deposition chamber 110.

In some embodiments, a second temperature sensor 143 and a second temperature controller 126 are coupled to the second gas delivery portion 121. The second temperature sensor 143 is configured to obtain thermal information from the second gas delivery portion 121. The second temperature controller 126 is configured to receive input from the second temperature sensor 143 to control, adjust, or set a temperature of the second heating assembly 127. The second temperature sensor 143 can be a thermocouple, a pyrometer, or the like.

Figure 2:
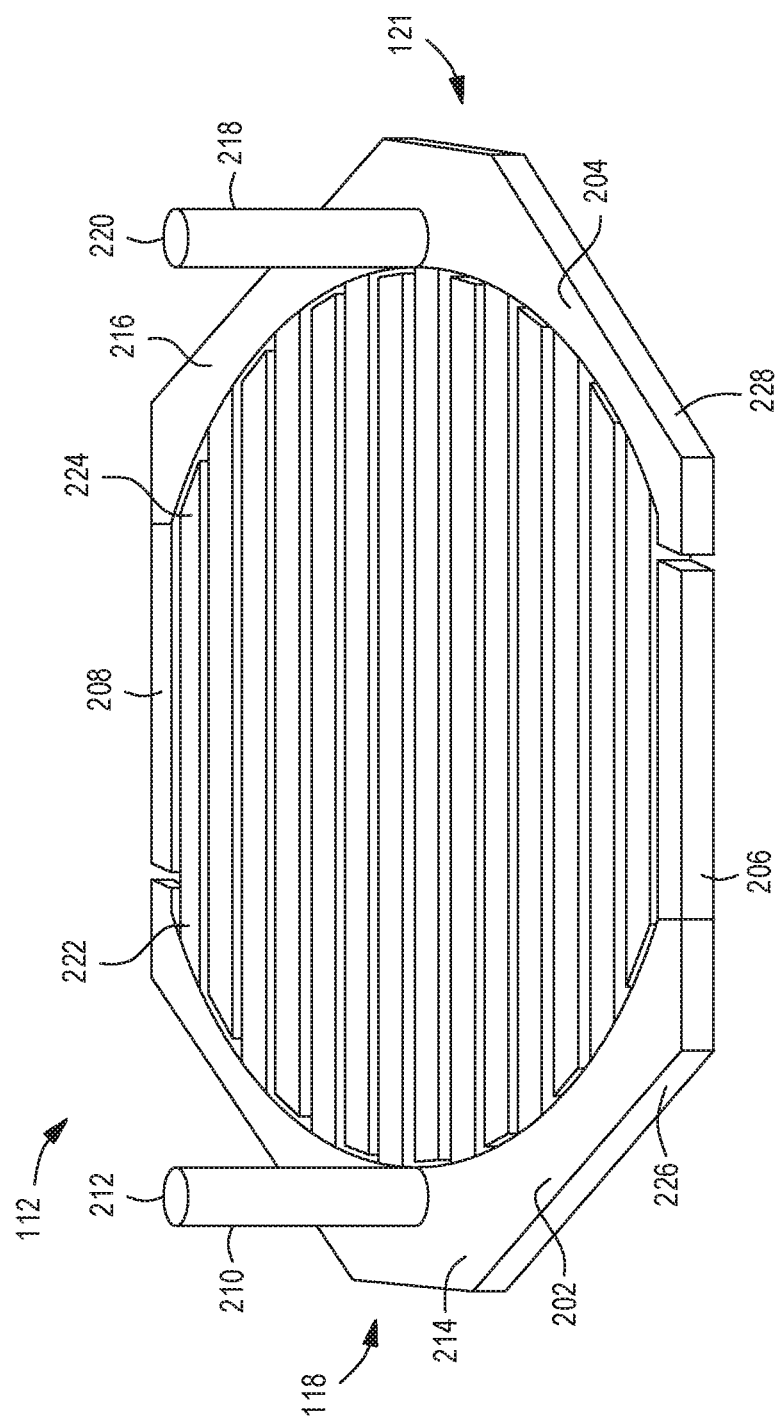
FIG. 2 shows a top right isometric view of a showerhead assembly in accordance with some embodiments of the present disclosure.

FIG. 2 shows a top right isometric view of a showerhead assembly in accordance with some embodiments of the present disclosure. The showerhead assembly 112 includes the first gas delivery portion 118 and the second gas delivery portion 121. The first gas delivery portion 118 includes a first body 202, a first inlet 210, and a plurality of first tubes 206. The first body 202 has an inner surface 222, an outer surface 226, and an upper surface 214. The plurality of first tubes 206 extend from the inner surface 222. In some embodiments, the plurality of first tubes 206 extend parallel to each other. The first inlet 210 extends from the upper surface 214 of the first body 202. In some embodiments, the first inlet 210 extends substantially perpendicular from the upper surface 214 of the first body 202. The first inlet 210 has an opening 212 at an end that extends away from the upper surface 214. The first body 202, the plurality of first tubes 206, and the first inlet 210 define a first plenum.

The second gas delivery portion 121 includes a second body 204, a second inlet 218, and a plurality of second tubes 208. The second body 204 has an inner surface 224, an outer surface 228, and an upper surface 216. The plurality of second tubes 208 extend from the inner surface 224. In some embodiments, the plurality of second tubes 208 extend parallel to each other. The second inlet 218 extends from the upper surface 216 of the second body 204. The second inlet 218 has an opening 220 at an end that extends away from the upper surface 216. The second body 204, the plurality of second tubes 208, and the second inlet 218 define a second plenum.

In some embodiments, as shown in FIG. 2, the inner surface 222 of the first body 202 and the inner surface 224 of the second body 204 have a curved profile. As shown in FIG. 2, the plurality of first tubes 206 and the plurality of second tubes 208 have a rectangular cross section. In some embodiments, the plurality of first tubes 206 can have a cross sectional shape other than rectangular, for example, circular, triangular, or the like. In some embodiments, the plurality of second tubes 208 can have a cross sectional shape other than rectangular, for example, circular, triangular, or the like. In some embodiments, the cross section of each tube of the plurality of first tubes 206 and plurality of second tubes 208 may be modulated, or varied, to increase temperature uniformity.

The plurality of first tubes 206 and the plurality of second tubes 208 have lengths such that they extend close to, without touching, the inner surface of the opposing body of the other respective gas delivery portion (e.g., the plurality of first tubes 206 extend close to, but do not touch, the second body 204, and the plurality of second tubes 208 extend close to, but do not touch, the first body 202). In some embodiments, the plurality of first tubes 206 and the plurality of second tubes 208 have varied lengths and are arranged to extend close to without touching, the opposite body of the other respective gas delivery portion. In some embodiments, the plurality of first tubes 206 and the plurality of second tubes 208 have a range of lengths from about 50 mm to about 180 mm. In some embodiments, the plurality of first tubes 206 and the plurality of second tubes 208 have a width about 4 mm to about 8 mm. In some embodiments, the plurality of first tubes 206 and the plurality of second tubes 208 have a height about 13 mm to about 17 mm.

Figure 3:
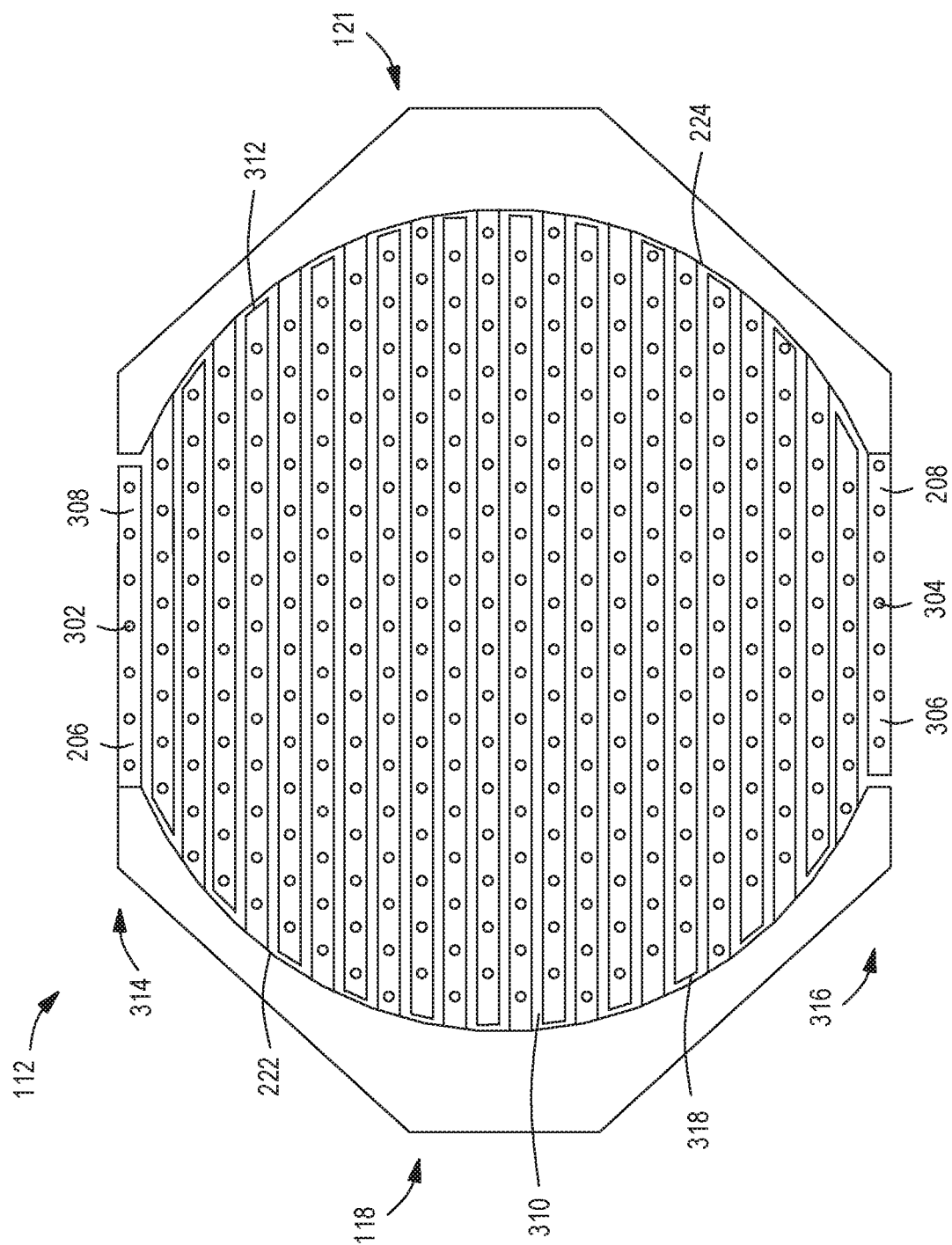
FIG. 3 shows a bottom view of a showerhead assembly in accordance with some embodiments of the present disclosure.

FIG. 3 shows a bottom view of the showerhead assembly in accordance with some embodiments of the present disclosure. The showerhead assembly 112 has a first end 314 and a second end 316. The first end 314 and the second end 316 define a width of the showerhead assembly 112. As shown, the plurality of first tubes 206 are disposed in an alternating pattern with the plurality of second tubes 208 across a width of the showerhead assembly 112. In some embodiments, the plurality of first tubes 206 are spaced equally across the width of the showerhead assembly 112. In some embodiments, the plurality of second tubes 208 are spaced equally across the width of the showerhead assembly 112. In some embodiments, the plurality of first tubes 206 and the plurality of second tubes 208 lie together in a common plane.

Each tube of the plurality of first tubes 206 defines a first gap 310 with each adjacent tube of the plurality of second tubes 208. In some embodiments, the first gap 310 is about 1 mm to about 10 mm, or in some embodiments, about 1 mm to about 5 mm. In some embodiments, the first gap 310 is about 2.5 mm. Each tube of the plurality of first tubes 206 defines a second gap 312 between an end of each first tube opposite the first body 202 and the inner surface 224 of the second body 204. In some embodiments, the second gap 312 is about 1 mm to about 10 mm. Each tube of the plurality of second tubes 208 defines a third gap 318 between an end of each second tube opposite the second body 204 and the first body 202. In some embodiments, the third gap 318 is about 1 mm to about 10 mm. As such, the first gas delivery portion 118 maintains a spaced relation with the second gas delivery portion 121. The spaced relation between the first gas delivery portion 118 and the second gas delivery portion 121 advantageously reduces or prevents thermal cross-talk between a first process material that flows through the first gas delivery portion 118 and a second process material that flows through the second gas delivery portion 121.

Each tube of the plurality of first tubes 206 includes a plurality of first holes 302 disposed on a bottom surface 308. In some embodiments, the plurality of first holes 302 have a diameter of about 0.5 mm to about 1 mm. The plurality of first holes 302 are disposed at regular intervals along a length of each first tube 206. In some embodiments, the plurality of first holes 302 are arranged in a rectilinear grid pattern across a span of the plurality of first tubes 206 such that the first process material that passes through the first gas delivery portion 118 can exit from the plurality of first holes 302 in a uniform pattern.

Each tube of the plurality of second tubes 208 includes a plurality of second holes 304 disposed on a bottom surface 306. In some embodiments, the plurality of second holes 304 have a diameter of about 0.5 mm to about 1 mm. In some embodiments, the diameter of the plurality of first holes 302 is the same as the diameter of the plurality of second holes 304. The plurality of second holes 304 are disposed at regular intervals along a length of each second tube 208. In some embodiments, the plurality of second holes 304 are arranged in a rectilinear grid pattern across a span of the plurality of second tubes 208 such that the second process material that passes through the second gas delivery portion 121 can exit from the plurality of second holes 304 in a uniform pattern. In some embodiments, each hole of the plurality of second holes 304 is generally disposed halfway between each hole of the plurality of first holes 302 across a width and length of the showerhead assembly 112. A rectilinear grid pattern of the plurality of first holes 302 and the plurality of second holes 304 advantageously facilitates uniform mixing of the first and second process materials as they exit the showerhead assembly 112.

Figure 4:
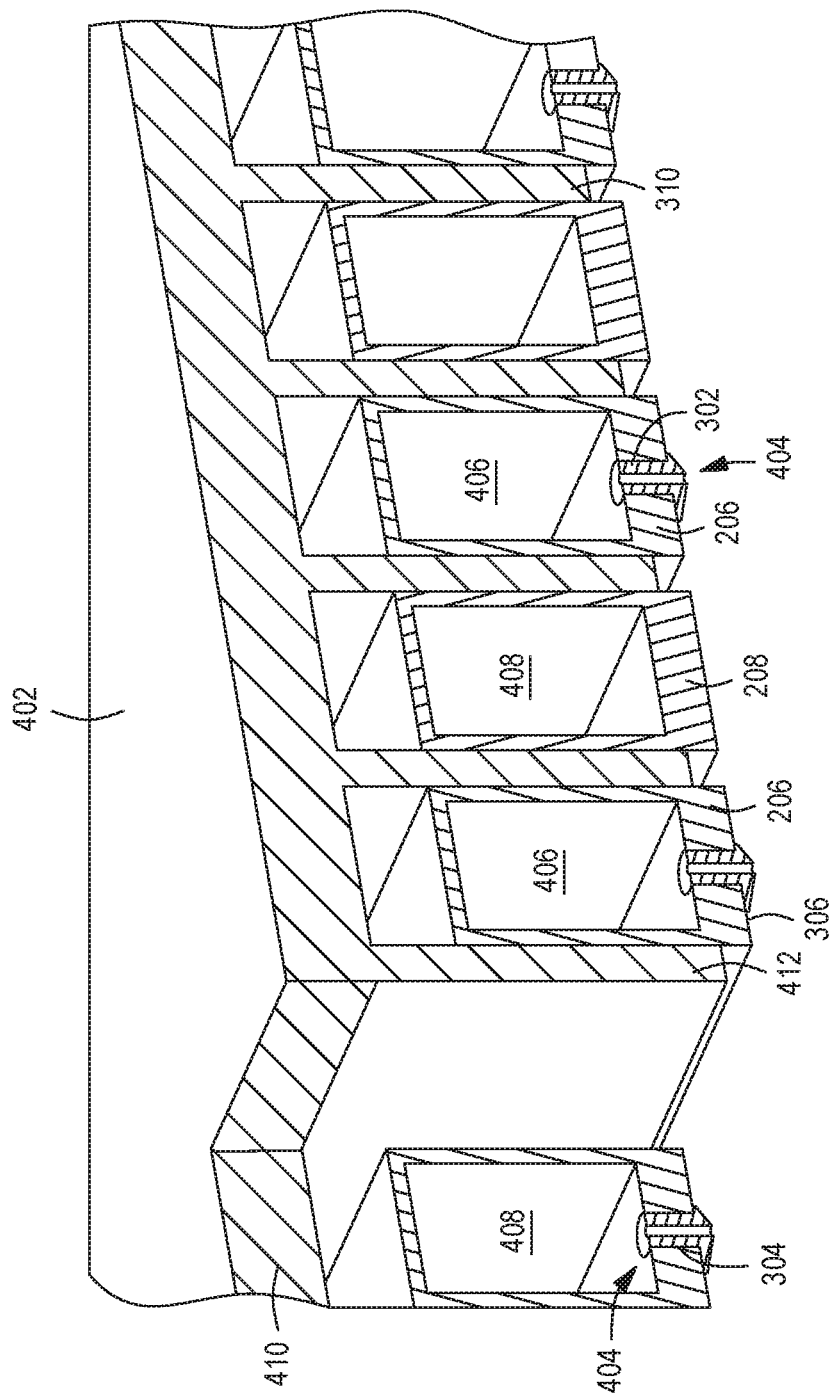
FIG. 4 shows a partial sectional view of a showerhead assembly in accordance with some embodiments of the present disclosure.

FIG. 4 shows a partial sectional view of a showerhead assembly in accordance with some embodiments of the present disclosure. The plurality of first tubes 206 (along with the first body 202 and the first inlet 210) define a first plenum 406. The plurality of second tubes 208 (along with the second body 204 and the second inlet 218) define a second plenum 408. The plurality of first tube 206 have a plurality of first holes 302. As shown in FIG. 4, a nozzle 404 may be placed in each hole of the plurality of first holes 302. Similarly, the nozzle 404 may be placed in each hole of the plurality of second holes 304. In some embodiments, the nozzle 404 can have an inner diameter of about 0.25 mm to about 2 mm. In some embodiments, the nozzle 404 can have an inner diameter of 1 mm. In some embodiments, the nozzle 404 comprises titanium, titanium alloy, or titanium nitride coated steel. The nozzle 404 can be configured to control speed, direction, and flow of process material. The nozzle 404 is configured to spray process material passing from the first plenum 406 and the second plenum 408 into the deposition chamber 110. Spraying of the process material can advantageously increases the uniformity of deposition of the process material onto the substrate 116. Spraying of the process material also advantageously increases the uniformity of mixing of the multiple process materials onto the substrate 116.

In some embodiments, a heat sink 402, having a conductivity of about 150 W/m–K or greater, is disposed between the plurality of first tubes 206 and the plurality of second tubes 208. The heat sink 402 includes a plate 410 and fins 412 extending from the plate 410 and into at least one of the first gap 310, the second gap 312, and the third gap 318. As discussed above, the first heating assembly 125 heats the first gas delivery portion 118. The second heating assembly 127 heats the second gas delivery portion 121. The heat sink 402 is configured to reduce or prevent heat from a hotter of the first gas delivery portion 118 and the second gas delivery portion 121 from radiating to the cooler of the two (i.e., thermal cross-talk). In some embodiments, the plate 410 comprises a conductive material that is conductively coupled to the lid 130. In some embodiments, the plate 410 comprises aluminum or titanium. In some embodiments, the fins 412 comprise thermally conductive material having a conductivity of about 150 W/m–K or greater. In some embodiments, the fins 412 advantageously comprise a thermally anisotropic material. A thermally anisotropic material is a material that has an in-plane thermal conductivity (conductivity in the basal plane) that is much greater than a transverse thermal conductivity of the material, thus allowing for increased temperature uniformity in the direction of the plane. Thermal Pyrolytic Graphite® (TPG) is an example of a thermally anisotropic material having an in-plane thermal conductivity of about 1,500 W/m–K and a transverse thermal conductivity of about 10 W/m–K. Other examples of suitable anisotropic materials include pyrolytic boron nitride, synthetic diamonds, or the like. In some embodiments, the fins 412 comprise TPG® encapsulated in aluminum foil or molybdenum foil, embedded copper in aluminum foil, or titanium nitride (TiN).

While the foregoing is directed to embodiments of the present disclosure, other and further embodiments of the disclosure may be devised without departing from the basic scope thereof.

The invention claimed is:

1. A showerhead assembly for depositing multiple materials on a substrate, comprising:
   a first gas delivery portion having a first body, a first inlet, and a plurality of first tubes extending from the first body that together define a first plenum, wherein each tube of the plurality of first tubes includes a plurality of first holes;
   a second gas delivery portion having a second body, a second inlet, and a plurality of second tubes extending from the second body that together define a second plenum fluidly independent from the first plenum, wherein each tube of the plurality of second tubes includes a plurality of second holes, and wherein the plurality of first tubes are disposed in an alternating pattern with the plurality of second tubes across a width of the showerhead assembly; and
   a heat sink disposed between and in physical contact with the plurality of first tubes and the plurality of second tubes, wherein the heat sink includes a plate and fins extending from the plate and into respective gaps disposed between adjacent ones of the plurality of first tubes and the plurality of second tubes, and wherein the fins comprise a thermally anisotropic material and the plate comprises a conductive material different than the thermally anisotropic material.

2. The showerhead assembly of claim 1, further comprising a first heating assembly thermally coupled to the first gas delivery portion, and a second heating assembly thermally coupled to the second gas delivery portion.

3. The showerhead assembly of claim 1, wherein each hole of the plurality of second holes is generally disposed between each hole of the plurality of first holes across a width and length of the showerhead assembly.

4. The showerhead assembly of claim 1, wherein the fins comprise thermally conductive material having a conductivity of about 150 W/m–K or greater.

5. The showerhead assembly of claim 1, further comprising a nozzle disposed in each of the plurality of first holes and each of the plurality of second holes.

6. The showerhead assembly of claim 1, wherein a first volume is disposed between the plate and each of the plurality of first tubes, wherein the first volume is fluidly separate from the first plenum and is defined between a continuous lower surface of the plate and an upper surface of a respective one of the plurality of first tubes.

7. The showerhead assembly of claim 1, wherein at least one of the first body and the second body includes an inner surface having a curved profile.

8. The showerhead assembly of claim 1, wherein the plurality of first tubes extend close to, without touching, an inner surface of the second body.

9. A showerhead assembly for depositing multiple materials on a substrate, comprising:
   a first gas delivery portion having a first body, a first inlet, and a plurality of first tubes extending from an inner surface of the first body that together define a first plenum, wherein each tube of the plurality of first tubes includes a plurality of first holes, and wherein the plurality of first tubes vary in length across a width of the showerhead assembly;

a second gas delivery portion having a second body, a second inlet, and a plurality of second tubes extending from an inner surface of the second body that together define a second plenum fluidly independent from the first plenum, wherein each tube of the plurality of second tubes includes a plurality of second holes, wherein the plurality of second tubes vary in length across the width of the showerhead assembly, and wherein the plurality of first tubes are disposed in an alternating pattern with the plurality of second tubes across the width of the showerhead assembly; and a heat sink disposed between the plurality of first tubes and the plurality of second tubes, wherein the heat sink includes a plate and fins extending from the plate, and wherein the fins comprise a thermally anisotropic material and the plate comprises a conductive material different than the thermally anisotropic material.

10. The showerhead assembly of claim 9, wherein each tube of the plurality of first tubes defines a first gap with each adjacent tube of the plurality of second tubes.

11. The showerhead assembly of claim 10, wherein the fins extend into respective gaps between adjacent ones of the plurality of first tubes and the plurality of second tubes, wherein each of the fins physically contact a respective one of the plurality of first tubes and a respective one of the plurality of second tubes.

12. The showerhead assembly of claim 10, wherein each tube of the plurality of first tubes defines a second gap between an end of each first tube opposite the first body and an inner surface of the second body.

13. The showerhead assembly of claim 12, wherein the second gap is about 1 mm to about 10 mm.

14. A deposition chamber, comprising:
 a chamber body having a floor, one or more sides, and a lid to define an interior volume;
 the showerhead assembly of claim 1 disposed in the interior volume; and
 a precursor delivery system configured to deliver a first process material to the first gas delivery portion at a first temperature and a second process material to the second gas delivery portion at the first temperature or at a second temperature different than the first temperature.

15. The deposition chamber of claim 14, wherein the first process material comprises tris (8-hydroxyquinolinato) aluminum (Alq3), or buckminsterfullerene ($C_{60}$).

16. The deposition chamber of claim 14, further comprising a first heating assembly coupled to the first gas delivery portion to apply heat to the first gas delivery portion, and a second heating assembly coupled to the second gas delivery portion to apply heat to the second gas delivery portion.

17. The deposition chamber of claim 14, further comprising a nozzle disposed in each of the plurality of first holes and each of the plurality of second holes.

\* \* \* \* \*